United States Patent [19]

Kuo

[11] Patent Number: 5,909,615
[45] Date of Patent: Jun. 1, 1999

[54] METHOD FOR MAKING A VERTICALLY REDUNDANT DUAL THIN FILM TRANSISTOR

[75] Inventor: Yue Kuo, Chappaqua, N.Y.

[73] Assignee: International Business Machines Corporation, Armonk, N.Y.

[21] Appl. No.: 08/929,925

[22] Filed: Sep. 15, 1997

Related U.S. Application Data

[62] Division of application No. 08/695,356, Aug. 9, 1996, Pat. No. 5,793,072
[60] Provisional application No. 60/012,466, Feb. 28, 1996.

[51] Int. Cl.$^6$ .......................... H01L 27/12; H01L 21/265
[52] U.S. Cl. .......................... 438/157; 438/193; 438/283; 257/241
[58] Field of Search .................................. 438/149, 156, 438/157; 257/74, 75, 67, 241

[56] References Cited

U.S. PATENT DOCUMENTS 5,567,959   10/1996   Mineji ........................................ 257/67
5,793,072    8/1998   Kuo ............................................ 257/67

*Primary Examiner*—Olik Chaudhuri
*Assistant Examiner*—William David Coleman
*Attorney, Agent, or Firm*—Douglas W. Cameron

[57] ABSTRACT

A thin film transistor having two vertically stacked channels and dual gate non-photosensitive structure, where the source drain to bottom gate structure is self-aligned. This structure occupies the same area on a substrate as a conventional single gate thin film transistor. This invention also discloses a process for manufacturing a dual gate structure with a simple three mask procedure.

12 Claims, 5 Drawing Sheets

METHOD FOR MAKING A VERTICALLY REDUNDANT DUAL THIN FILM TRANSISTOR

This is a divisional application of U.S. patent application Ser. No. 08/695,356 to Y. Kuo, filed on Aug. 9, 1996 now U.S. Pat. No. 5,793,072.

CROSS-REFERENCE TO RELATED APPLICATIONS OF

The present application claims priority to co-pending U.S. provisional application 60/012,466 filed on Feb. 28, 1996.

DESCRIPTION

1. Technical Field

This invention relates to a dual thin film transistor structure and a method for producing the structure.

2. Description of the Prior Art

Amorphous silicon (a-Si:H) thin film transistors (TFTs) have been the dominate device in high quality, large area liquid crystal displays (LCDs). They are also used in solid state imagers, detectors, sensors, and electrical erasable programmable read-only memories (EEPROM's). For most of these applications, the substrate is divided into a large number of pixel array. One TFT is attached to one pixel. These TFTs are connected with conductive metal lines in the x- or y-direction. Since the TFT occupies a portion of the pixel area, only part of the pixel is available for functions such as the transmission of light. The percentage of the non-TFT-occupied area in a pixel is called the aperture ratio. For practical purposes, the TFT occupied area should be as small as possible, i.e., the aperture ratio should be maximized. The substrate is usually transparent glass although a non-transparent substrate can be used for certain applications. The glass size can be very large, such as 550 mm by 650 mm, or small. An a-Si:H TFT has two intrinsic disadvantages: low field effect mobility ($\mu_{eff}$) and high photosensitivity. The mobility is usually limited to less than 1.5 cm$^2$/Vs. In order to improve the mobility, the a-Si:H layer needs to be replaced by other materials, such as polysilicon or cadmium selenide (CdSe). The photosensitivity problem can be solved by several methods: 1) using a tri-layer structure with a proper top channel passivation layer; 2) thinning the a-Si:H layer thickness; 3) introducing defect centers in the a-Si:H layer, and 4) adding a light blocking layer. The first two methods are effective in decreasing the photo-leakage current, but they cannot totally eliminate the photosensitivity. The third method is rarely used in real applications because it deteriorates other transistor characteristics such as the mobility. The light blocking layer, which can be a polymeric or a metallic material, is most commonly applied to TFT LCD products. When an organic polymer is used, a thick layer is required due to its low optical density. When a metal layer is used, it is usually deposited on the opposite plate of the TFT plate. The light from the backlight source could be reflected from the metal pattern to the top of the TFT, which causes photo-leakage. In addition, these light blocking layers are passive devices that do not enhance the TFT performance.

The most serious problem in the fabrication of a large area TFT array is the low yield. In order to increase the production yield, many redundant structures, e.g., for dielectric layers and metal lines, are used. They are effective in preventing certain types of defects, such as the shortage between the top and bottom metal lines and the opening of metal lines. Few structures can supply redundant TFTs, which are critical to random defects. There are reports on attaching two TFTs to one pixel. They occupy double the area of one TFT, which decreases the aperture ratio of the pixel. For LCD applications, the aperture ratio directly influences the display performance and the power consumption. Therefore, it is desirable to have a redundant TFT structure that occupies the same area as one TFT.

SUMMARY OF THE INVENTION

It is therefore an object of this invention to provide a vertically redundant thin film transistor.

It is another object of this invention to provide a vertically redundant thin film transistor which is non-photosensitive.

It is another object of this invention to provide a vertically redundant thin film transistor which occupied a minimum surface area on a substrate.

It is also an object of this invention to maximize the $I_{on}/I_{off}$ ratio.

It is also an object of this invention to manufacture the vertically redundant thin film transistor with a minimum number of masking steps.

It is also an object of this invention to provide a self-aligned thin film transistor structure which minimizes the source/drain to gate parasitic capacitance. This structure is useful in liquid crystal display and in 2-D imager applications.

It is also an object of this invention to reduce the aperture area in liquid crystal displays when using redundant thin film transistors.

This invention teaches a thin filmed transistor having vertically redundant stacked channels and a dual gate structure, where the semiconductor channels are sandwiched between the two gates and where the source/drain is self-aligned to the bottom gate.

One embodiment of this invention describes a method of producing a vertically redundant thin film transistor using a simple three mask process.

In this invention, a new type of TFT is disclosed. This TFT has a vertically redundant dual channel structure, as shown in FIG. 1. In another words, two TFTs, i.e., top-gate and bottom-gate TFTs, are fabricated on top of each other. Therefore, the whole TFT occupies the sme area as one conventional TFT does. In addition, the silicon channels are totally enclosed by the opaque gates of the two TFTs. Therefore, the new TFT is non-photosensitive. The TFT characteristics, such as the on current, are better than the conventional TFT. Several methods of fabricating the vertically redundant TFT are disclosed in this invention.

DESCRIPTION OF THE PREFERRED EMBODIMENT

Figure 1A:
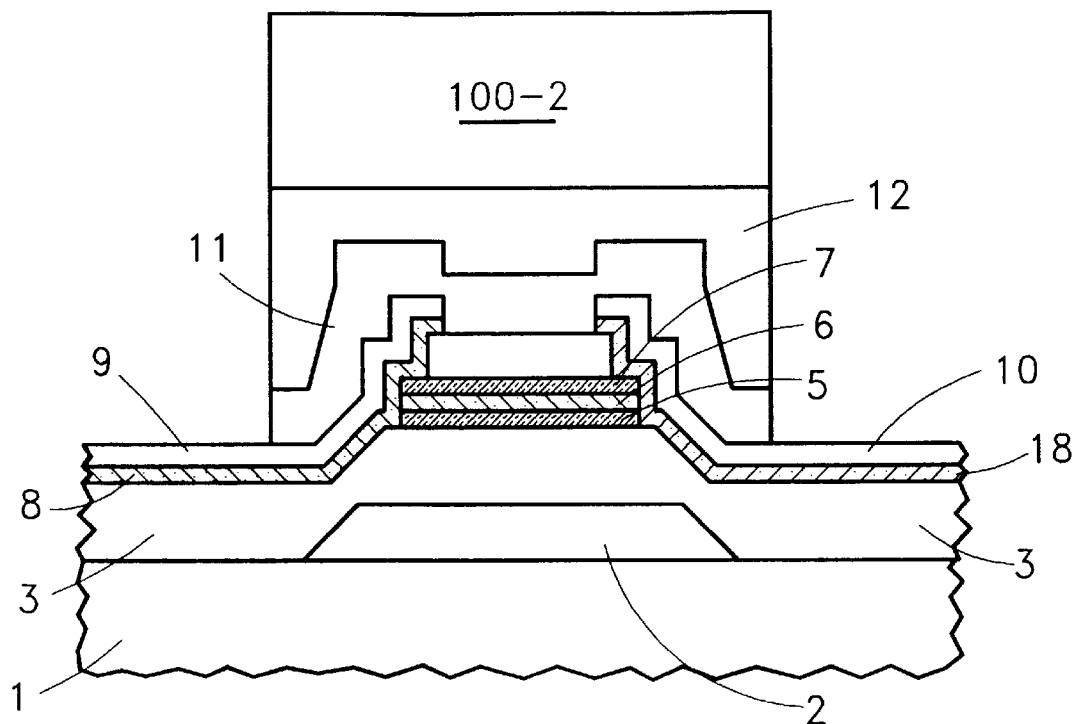
FIG. 1A schematically illustrates the vertically redundant thin film transistor structure of this invention with an exposed source and drain.
Figure 1B:
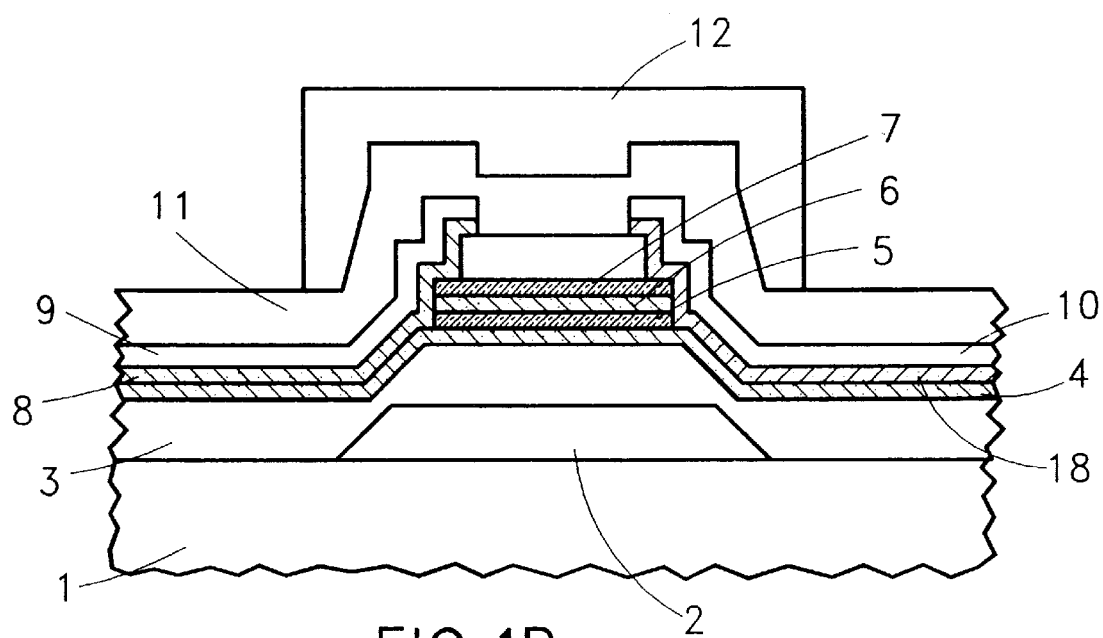
FIG. 1B schematically illustrates the vertically redundant thin film transistor structure of this invention with source and drain covered by a fourth dielectric layer 11.

Show in FIG. 1 are two vertically stacked thin film transistors (TFT). The top TFT is positioned immediately on the top of the bottom TFT, and these two transistors share the same source 9 and drain 10, and the same n+ semiconductor layer 8 and 18 under the source/drain metal. The bottom TFT is composed of the following layers: a bottom gate 2, a first dielectric layer 3, such as silicon nitride, a first semiconductor layer 4, such as amorphous silicon, a second dielectric layer 5, such as silicon nitride, a heavily doped n+ semiconductor layer 8 and 18, and a second conductive metal layer 9 and 10 for the source and drain respectively. The top TFT is composed of: a second dielectric layer 5 such as silicon nitride, a second semiconductor layer 6 such as amorphous silicon, a third dielectric layer 7 such as silicon nitride, a fourth dielectric layer 11 such silicon nitride, a third conductive layer 12 such as a metal layer, the second metal layer which is the source 9 and drain 10 above, and the n+ semiconductor layer 8 described above.

For the first semiconductor layer 4 and the second semiconductor layer 6, one could use amorphous silicon, polysilicon, cadmium selenide, or other equivalent semiconductor material. For the three metal layers a metal with high conductivity is preferred, for example, the refractory metals such as molybdenum, tantalum, and alloys of the refractory metals. Other metals such as copper and aluminum may be used, but they may be more difficult to handle than the refractory metals. For the four dielectric layers, one could use, for example, silicon nitride, silicon oxide, silicon oxynitride, or tantalum oxide or aluminum oxide, or any combination of these materials.

The method of producing the structure described in FIG. 1 will now be described.

Figure 2:
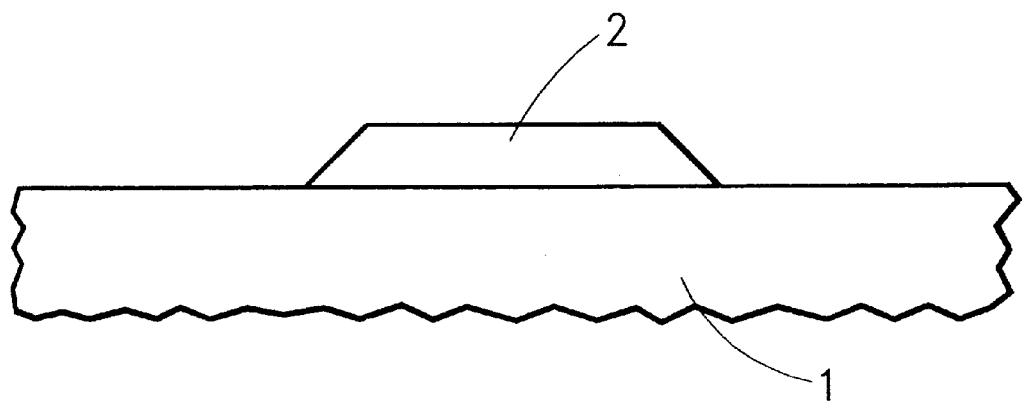
FIG. 2 schematically illustrates the bottom gate on the glass substrate, where the bottom gate is a conductive layer.
Figure 3:
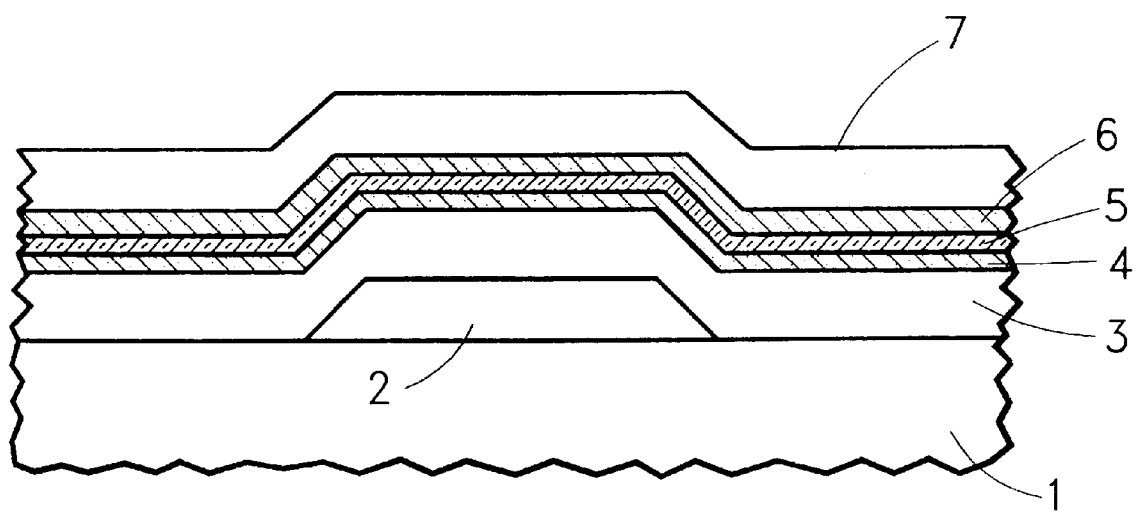
FIG. 3 schematically illustrates the alternate deposition of three dielectric layers and two semiconductor layers on the structure of FIG. 2.
Figure 4:
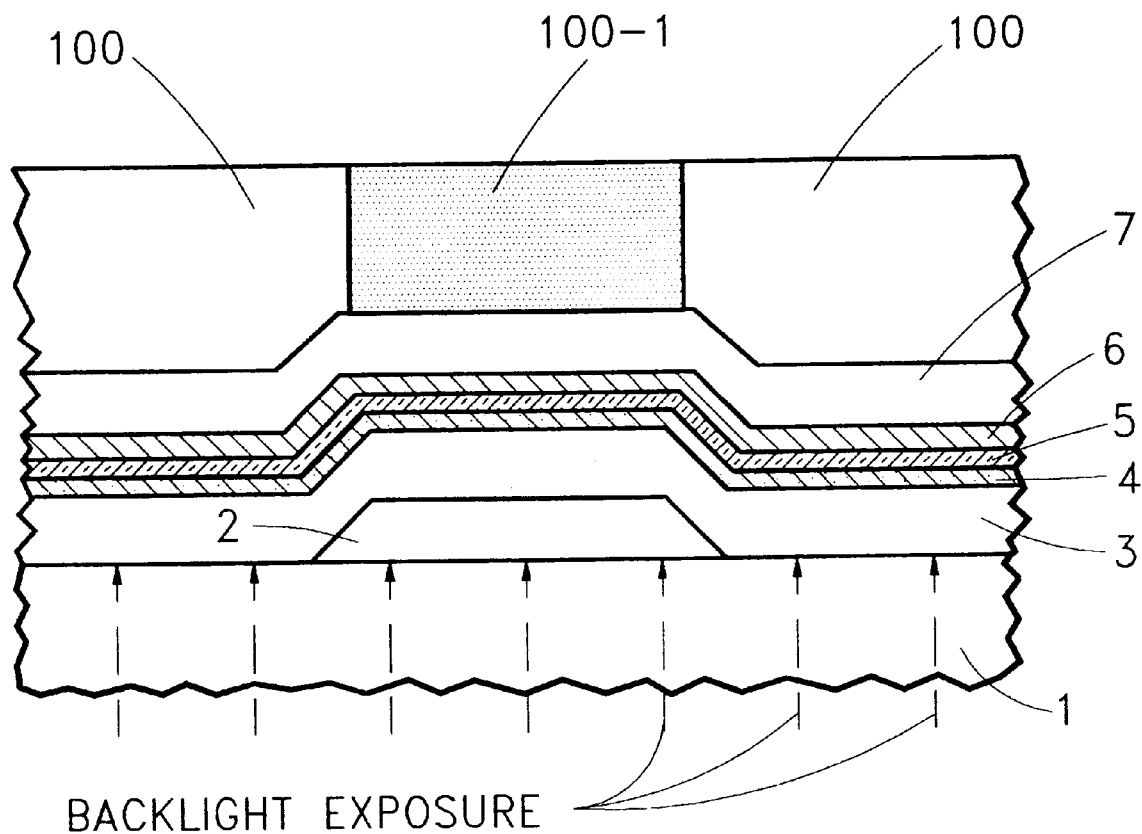
FIG. 4 schematically illustrates back light exposure under the bottom gate with a positive photoresist layer deposited on top of the structure to define the source and drain contact regions.
Figure 5A:
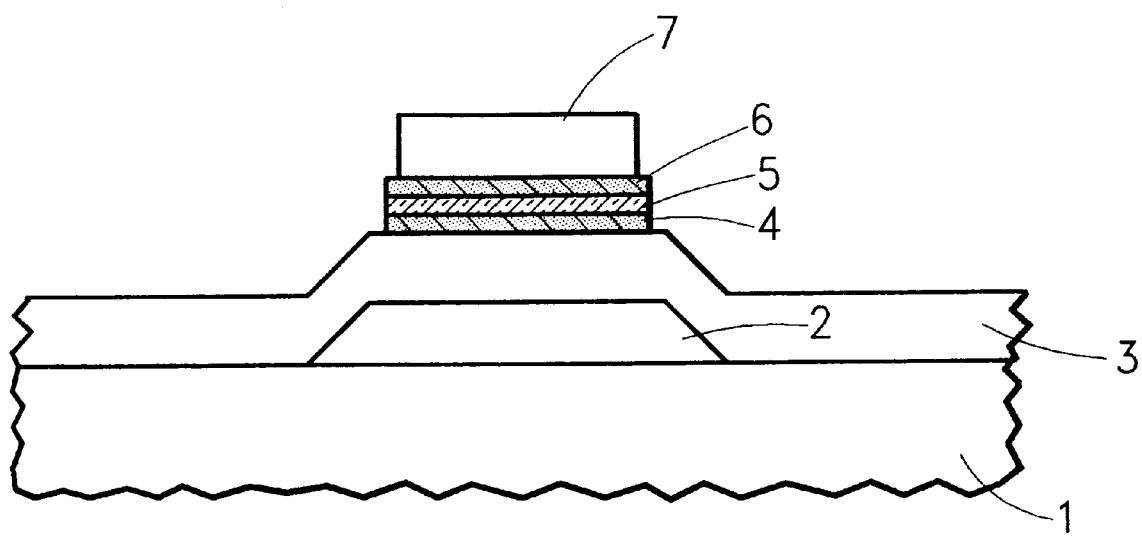
FIG. 5A schematically illustrates the structure of FIG. 4 after removing the exposed photoresist area. The unexposed photoresist layer is used as a mask to etch off layers 4–7 as shown in FIG. 5A.
Figure 5B:
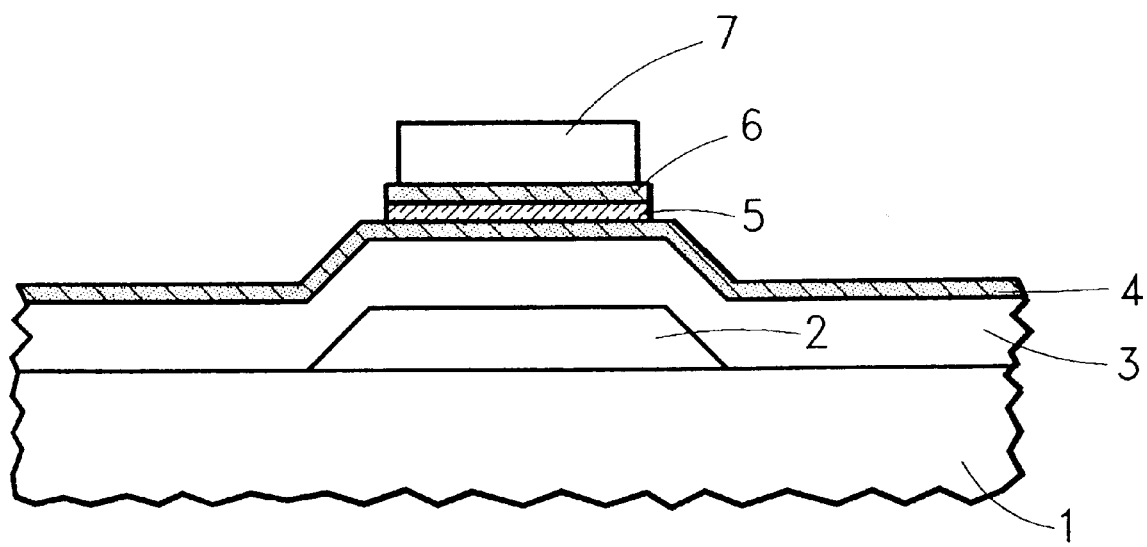
FIG. 5B is the same as FIG. 5A except layers 5 through 7 are etched without etching layer 4.
Figure 6A:
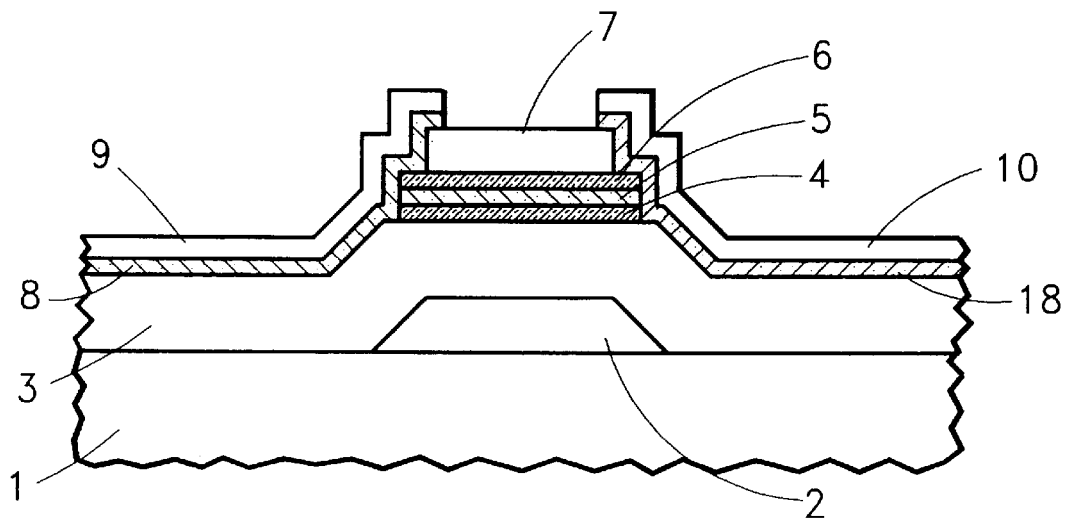
FIG. 6A illustrates a structure with the source and drain defined for the first time in the process of this invention.
Figure 6B:
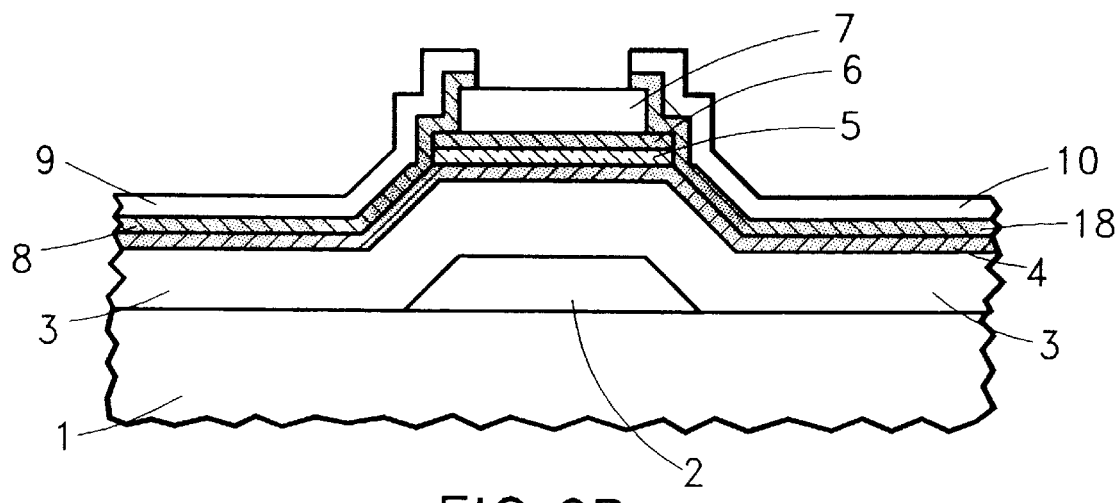
FIG. 6B is the same as FIG. 6A except the first semiconductor layer is etched with the same mask as the n+ semiconductor layer.

Referring to FIG. 2, starting with a glass substrate 1 such as Corning 7059, the first conductive layer is deposited on the substrate surface using a first mask to define the bottom gate 2 in accordance with conventional procedures. After the completion of bottom gate 2, layers 3 through 7 are sequentially deposited on the bottom gate, preferably in one pump down, see FIG. 3. Following the deposition of the films just described, a photoresist layer 100 is spun on and soft baked on the films 3–7 as shown in FIG. 4. Then, back light exposure is applied using a mercury lamp under the bottom gate and through layers 3–7 and the photoresist layer as shown in FIG. 4. After exposure, the photoresist layer is developed to form a contact pattern 100-1, which is self-aligned to the bottom gate. Then, the third dielectric layer 7 is etched with an etching solution using the contact pattern as a mask. An etching solution such as buffered hydrofluoric acid can be used for Plasma Enhanced Chemical Vapor Deposited (PECVD) silicon nitride. After etching with the etching solution, layers 4–6 are plasma etched with contact pattern 100-1. One example of the plasma etching that can be used is preferably Reactive Ion Etching (RIE). After the two etching steps described immediately above, the photoresist layer is stripped as shown in FIG. 5A. Then, as shown as in FIG. 6, a heavily doped n+ semiconductor layer is deposited. The depositing of the n+ semiconductor layer is done using PECVD. Then, the metal layer is deposited using the sputtered deposition method. Then, the second conductive layer is patterned and etched with a mask which defines the source metal 9 and the drain metal 19 regions of the thin film transistor. The n+ semiconductor layer is etched, using the same mask, to form the n+ source region 8 and n+ drain region 18. At this point, after stripping the remaining photoresist pattern, the bottom TFT is now complete.

The formation of the remaining portions the top TFT will now be described. Following the procedure described in the previous paragraph, a fourth dielectric layer is deposited, and then, a third conductive layer is deposited on the fourth dielectric layer. The third conductive layer is patterned with mask 100-2 to define the top gate region of the top TFT. The third conductive layer is then etched with the mask to form the top gate 12 of the top TFT. At this point the two TFTs, which are vertically positioned on top of each other and share a common source and drain, are now formed. However, following the etching of the third conductive layer as described immediately above, a fourth dielectric could be etched to expose the source drain metal layers 9 and 19 respectively. See FIG. 1.

As an option, instead of plasma etching the second semiconductor, the second dielectric, and the first semiconductor layers with the contact pattern, one could etch only the second semiconductor and second dielectric layers with the contact pattern. This option would require etching the second conductive layer, the n+ semiconductor layer, and the first semiconductor layer, with the mask to form the source and drain from the source and drain regions.

As an alternative back light exposure for defining the source and drain contact regions, one could apply and expose the mask, which is aligned to the bottom gate to define these regions. As yet another alternative to the basic process described above, one could change three steps in the basic process as follows. First, instead of applying back light exposure to define the source drain regions, one could use a mask to line to the bottom gate to define the source drain regions. As an alternative to the step of plasma etching the three layers in the basic process, one could plasma etch only two layers and not plasma etch the first semiconductor layer. The latter step would further require etching three layers instead of two. These three layers would be the second conductive layer, the n+ semiconductor layer, and the first semiconductor layer. These three layers would be etched with a mask to form a source and drain from the source and drain regions.

Yet as another alternative to the basic process, one could plasma etch two layers instead of the three layers that were plasma etched in the basic process. The first semiconductor layer is not plasma etched as in the basic process. Also, instead of depositing a heavily doped n+ semiconductor layer after stripping the photoresist layer, ion implantation or non-mass separation ion shower implantation is used. Finally, the third difference in this alternative to the basic process, instead of etching two layers to form the common source/drain of the thin film transistors, three layers are etched to form these regions, the three layers being the second conductive, the n+ semiconductor and the first semiconductor layers. Instead of using back light exposure in this alternative, one could also use a mask aligned to the bottom gate to the source and drain contact regions.

Having thus described our invention, what we claim as new and desire to secure by Letters Patents is:

1. A method of constructing a vertically redundant dual thin film transistor, said method comprising:
   a) depositing and etching a bottom gate pattern on a substrate, said gate being a first conductive layer;
   b) depositing the following layers in the following order on said substrate:
      a first dielectric layer, a first semiconductor layer on said first dielectric layer, a second dielectric layer on said first semiconductor layer, a second semiconductor layer on said second dielectric layer, and a third dielectric layer on said second semiconductor layer;
   c) depositing a positive photoresist layer on the top of said layers of step b;
   d) applying backlight exposure under said bottom gate and through said layers of step b and on said photoresist layer;
   e) developing said photoresist layer after said exposure of step d to form a contact pattern, which is self-aligned to said bottom gate;
   f) etching said third dielectric layer with an etching solution with said contact pattern;
   g) plasma etching said second semiconductor, second dielectric and first semiconductor layers with said contact pattern;
   h) stripping said photoresist layer after etching in step f) and g);
   i) depositing a heavily doped n$^+$ semiconductor layer after stripping said photoresist layer;
   j) depositing a second conductive layer after step i);
   k) patterning said second conductive layer with a mask which defines a source and drain region of said thin film transistor;
   l) etching said second conductive layer and said n$^+$ semiconductor layer using said mask to form a source and drain from said source and drain regions;
   m) depositing a fourth dielectric layer after step l);
   n) depositing a third conductive layer on said fourth dielectric layer;
   o) patterning said third conductive layer with a mask which defines a top gate region of said thin film transistor; and
   p) etching said third conductive layer using said mask to form a top gate from said top gate region,
thereby forming two thin film transistors vertically positioned on top of each other and sharing a common source and drain.

2. A method as recited in claim 1, further comprising the step of etching said fourth dielectric layer using said mask to expose said source and said drain.

3. A method of constructing a vertically redundant dual thin film transistor, said method comprising:
   a) depositing and etching a bottom gate pattern on a substrate, said gate being a first conductive layer;
   b) depositing the following layers in the following order on said substrate:
      a first dielectric layer, a first semiconductor layer on said first dielectric layer, a second dielectric layer on said first semiconductor layer, a second semiconductor layer on said second dielectric layer, and a third dielectric layer on said second semiconductor layer;
   c) depositing a positive photoresist layer on the top of said layers of step b;
   d) applying backlight exposure under said bottom gate and through said layers of step b and on said photoresist layer;
   e) developing said photoresist layer after said exposure of step d to form a contact pattern, said self-aligned to the bottom gate;
   f) etching said third dielectric layer with an etching solution with said contact pattern;
   g) plasma etching said second semiconductor layer, and said second dielectric layer with said contact pattern;
   h) stripping said photoresist layer after etching in step f) and g);
   i) depositing a heavily doped n$^+$ semiconductor layer after stripping said photoresist layer; and
   j) depositing a second conductive layer after step i);
   k) patterning said second conductive layer with a mask which defines a source and drain region of said thin film transistor;
   l) etching said second conductive layer, said n$^+$ semiconductor layer and said first semiconductor layer, using said mask to form a source and drain from said source and drain regions;
   m) depositing a fourth dielectric layer after step l);
   n) depositing a third conductive layer on said fourth dielectric layer;
   o) patterning said third conductive layer with a mask which defines a top gate region of said thin film transistor; and
   p) etching said third conductive layer using said mask to form a top gate from said top gate region,
thereby forming two thin film transistors vertically positioned on top of each other and sharing a common source and drain.

4. A method as recited in claim 3, further comprising the step of etching said fourth dielectric layer using said mask to expose said source and said drain.

5. A method of constructing a vertically redundant dual thin film transistor, said method comprising:
   a) depositing and etching a bottom gate pattern on a substrate, said gate being a first conductive layer;
   b) depositing the following layers in the following order on said substrate:
      a first dielectric layer, a first semiconductor layer on said first dielectric layer, a second dielectric layer on said first semiconductor layer, a second semiconductor layer on said second dielectric layer, and a third dielectric layer on said second semiconductor layer;
   c) depositing a positive photoresist layer on the top of said layers of step b;
   d) applying and exposing a mask which is aligned to said bottom gate to define source and drain contact regions;
   e) developing said photoresist layer after said exposure of step d to form a contact pattern;
   f) etching said third dielectric layer with an etching solution with said contact pattern;
   g) plasma etching said second semiconductor, second dielectric and first semiconductor layers with said contact pattern;
   h) stripping said photoresist layer after etching in step f) and g);
   i) depositing a heavily doped n$^+$ semiconductor layer after stripping said photoresist layer;
   j) depositing a second conductive layer after step i);

k) patterning said second conductive layer with a mask which defines a source and drain region of said thin film transistor;

l) etching said second conductive layer and said n+ semiconductor layer using said mask to form a source and drain from said source and drain regions;

m) depositing a fourth dielectric layer after step l);

n) depositing a third conductive layer on said fourth dielectric layer;

o) patterning said third conductive layer with a mask which defines a top gate region of said thin film transistor; and p) etching said third conductive layer using said mask to form a top gate from said top gate region, thereby forming two thin film transistors vertically positioned on top of each other and sharing a common source and drain.

6. A method as recited in claim 5, further comprising the step of etching said fourth dielectric layer using said mask to expose said source and said drain.

7. A method of constructing a vertically redundant dual thin film transistor, said method comprising:

a) depositing and etching a bottom gate pattern on a substrate, said gate being a first conductive layer;

b) depositing the following layers in the following order on said substrate:
a first dielectric layer, a first semiconductor layer on said first dielectric layer, a second dielectric layer on said first semiconductor layer, a second semiconductor layer on said second dielectric layer, and a third dielectric layer on said second semiconductor layer;

c) depositing a positive photoresist layer on the top of said layers of step b;

d) applying and exposing a mask which is aligned to said bottom gate to define source and drain contact regions;

e) developing said photoresist layer after said exposure of step d to form a contact pattern;

f) etching said third dielectric layer with an etching solution with said contact pattern;

g) plasma etching said second semiconductor layer, and second dielectric layer with said contact pattern;

h) stripping said photoresist layer after etching in step f) and g);

i) depositing a heavily doped n+ semiconductor layer after stripping said photoresist layer; and j) depositing a second conductive layer after step i);

k) patterning said second metallic with a mask which defines a source and drain region of said thin film transistor;

l) etching said second conductive layer, said n+ semiconductor layer and said first semiconductor layer, using said mask to form a source and drain from said source and drain regions;

m) depositing a fourth dielectric layer after step l);

n) depositing a third conductive layer on said fourth dielectric layer;

o) patterning said third conductive layer with a mask which defines a top gate region of said thin film transistor;

p) etching said third conductive layer using said mask to form a top gate from said top gate region.

8. A method as recited in claim 7, further comprising the step of etching said fourth dielectric layer using said mask to expose said source and said drain.

9. A method of constructing a vertically redundant dual thin film transistor, said method comprising:

a) depositing and etching a bottom gate pattern on a substrate, said gate being a first conductive layer;

b) depositing the following layers in the following order on said substrate:
a first dielectric layer, a first semiconductor layer on said first dielectric layer, a second dielectric layer on said first semiconductor layer, a second semiconductor layer on said second dielectric layer, and a third dielectric layer on said second semiconductor layer;

c) depositing a positive photoresist layer on the top of said layers of step b;

d) applying backlight exposure under said bottom gate and through said layers of step b and on said photoresist layer;

e) developing said photoresist layer after said exposure of step d to form a contact pattern, said self-aligned to the bottom gate;

f) etching said third dielectric layer with an etching solution with said contact pattern;

g) plasma etching said second semiconductor, second dielectric layers with said contact pattern;

h) stripping said photoresist layer after etching in step f and g);

i) preparing a heavily doped n+ semiconductor contact region by ion implantation or non-mass separation ion shower implantation;

j) depositing a second conductive layer after step i);

k) patterning said first metallic with a mask which defines a source and drain region of said thin film transistor;

l) etching said second conductive layer, and said first semiconductor layer;

m) depositing a fourth dielectric layer after step l);

n) depositing a third conductive layer on said fourth dielectric layer;

o) patterning said third conductive layer with a mask which defines a top gate region of said thin film transistor;

p) etching said third conductive layer using said mask to form a top gate from said top gate region, thereby forming two thin film transistors vertically positioned on top of each other and sharing a common source and drain.

10. A method as recited in claim 9, further comprising the step of etching said fourth dielectric layer using said mask to expose said source and said drain.

11. A method of constructing a vertically redundant dual thin film transistor, said method comprising:

a) depositing and etching a bottom gate pattern on a substrate, said gate being a first conductive layer;

b) depositing the following layers in the following order on said substrate:
a first dielectric layer, a first semiconductor layer on said first dielectric layer, a second dielectric layer on said first semiconductor layer, a second semiconductor layer on said second dielectric layer, and a third dielectric layer on said second semiconductor layer;

c) depositing a positive photoresist layer on the top of said layers of step b;

d) applying and exposuring a mask which is aligned to said bottom gate to define source and drain contact regions;

e) developing said photoresist layer after said exposure of step d to form a contact pattern;

f) etching said third dielectric layer with an etching solution with said contact pattern;

g) plasma etching said second semiconductor, second dielectric and first semiconductor layers with said contact pattern;

h) stripping said photoresist layer after etching in step f) and g);

i) preparing a heavily doped $n^+$ semiconductor contact region by ion implantation or non-mass separation ion shower implantation;

j) depositing a second conductive layer after step i);

k) patterning said second conductive layer with a mask which defines a source and drain region of said thin film transistor;

l) etching said second conductive layer, and said first semiconductor layer;

m) depositing a fourth dielectric layer after step l);

n) depositing a third conductive layer on said fourth dielectric layer;

o) patterning said third conductive layer with a mask which defines a top gate region of said thin film transistor; and p) etching said third conductive layer using said mask to form a top gate from said top gate region, thereby forming two thin film transistors vertically positioned on top of each other and sharing a common source and drain.

12. A method as recited in claim 11, further comprising the step of etching said fourth dielectric layer using said mask to expose said source and said drain.

* * * * *